US010951009B2

(12) United States Patent
Johnson et al.

(10) Patent No.: US 10,951,009 B2
(45) Date of Patent: Mar. 16, 2021

(54) TUNABLE VCSEL POLARIZATION CONTROL THROUGH DISSIMILAR DIE BONDING

(71) Applicant: Axsun Technologies, Inc., Billerica, MA (US)

(72) Inventors: Bartley C. Johnson, North Andover, MA (US); Mark R. Malonson, Merrimac, MA (US); Walid A. Atia, Jamaica Plain, MA (US); Mark E. Kuznetsov, Lexington, MA (US); James W. Getz, Brookline, MA (US); Peter S. Whitney, Lexington, MA (US)

(73) Assignee: Excelitas Technologies Corp., Waltham, MA (US)

( * ) Notice: Subject to any disclaimer, the term of this patent is extended or adjusted under 35 U.S.C. 154(b) by 0 days.

(21) Appl. No.: 16/409,295

(22) Filed: May 10, 2019

(65) Prior Publication Data

US 2019/0348815 A1 Nov. 14, 2019

Related U.S. Application Data

(60) Provisional application No. 62/670,514, filed on May 11, 2018.

(51) Int. Cl.

| | |
|---|---|
| ***H01S 5/183*** | (2006.01) |
| ***H01S 5/34*** | (2006.01) |
| ***H01S 5/022*** | (2021.01) |
| ***H01S 5/06*** | (2006.01) |
| *H01S 5/343* | (2006.01) |
| *H01S 5/32* | (2006.01) |

(52) U.S. Cl.
CPC ........ *H01S 5/3404* (2013.01); *H01S 5/02248* (2013.01); *H01S 5/02276* (2013.01); *H01S 5/0607* (2013.01); *H01S 5/1838* (2013.01); *H01S 5/18355* (2013.01); *H01S 5/18366* (2013.01); *H01S 5/3201* (2013.01); *H01S 5/343* (2013.01)

(58) Field of Classification Search
CPC ......................... H01S 5/18355; H01S 5/18366
See application file for complete search history.

(56) References Cited

U.S. PATENT DOCUMENTS

| | | | | |
|---|---|---|---|---|
| 6,785,318 B1 * | 8/2004 | Matsui | .................. | B82Y 20/00 372/45.01 |
| 9,391,422 B2 | 7/2016 | Cable et al. | | |

(Continued)

FOREIGN PATENT DOCUMENTS

| | | |
|---|---|---|
| EP | 0924820 | 6/1999 |

OTHER PUBLICATIONS

Ansbaek, T., "Vertical-Cavity Surface-Emitting Laser for Medical Diagnosis," Department of Photonics Engineering, 1-148 (2012).

(Continued)

*Primary Examiner* — Michael Carter
(74) *Attorney, Agent, or Firm* — HoustonHogle LLP

(57) ABSTRACT

A design and method for introducing asymmetric crystal strain to control polarization in a tunable VCSEL, either optically or electrically pumped. The invention is especially relevant to wafer- or die-bonded tunable VCSELs. Then, mechanical stress is applied to the half VCSEL device by asymmetric arrangement of metal bond pads.

13 Claims, 3 Drawing Sheets

X1
GP4
112
GP3
GP1
Z1
GP2
Z
Y
X

(56) References Cited

U.S. PATENT DOCUMENTS

| | | | | |
|---|---|---|---|---|
| 2014/0176958 A1* | 6/2014 | Flanders | ................ | H01S 5/183 356/479 |
| 2016/0028208 A1 | 1/2016 | Cable et al. | | |
| 2019/0234821 A1* | 8/2019 | Besling | ................ | B81B 3/0021 |

OTHER PUBLICATIONS

Bobrov, M.A., et al., "VCSEL Polarization Control by Rhomboidal Selectively-Oxidized Current Aperture," 2016 International Conference Laser Optics (LO) p. R3-16 (2016).
Debernardi, P., et al. "Reliable Polarization Control of VCSELs Through Monolithically Integrated Surface Gratings: A Comparative Theoretical and Experimental Study," IEEE Journal of Selected Topics in Quantum Electronics, 11 (1): 107-116 (2005).
Ha, K.-H., et al., "Polarization Control of Vertical-Cavity Surface-Emitting Lasers by Asymmetric Oxide-Aperture," IEEE, 890-891 (1999).
Jayaraman, V., et al., "VCSEL Swept Light Sources," Optical Coherence Tomography, 659-686 (2015).
Matsui, Y., et al., "Complete Polarization Mode Control of Long-Wavelength Tunable Vertical-Cavity Surface-Emitting Lasers Over 65-nm Tuning, Up to 14-mW Output Power," IEEE Journal of Quantum Electronics, 39(9): 1037-1048 (2003).
Monti di Sopra, F., et al., "Polarization Control in Strained T-bar VCSELs," IEEE Photonics Technology Letters, 14(8): 1034-1036 (2002).
Nishiyama, N., et al., "Highly Strained GaInAs—GaAs Quantum-Well Vertical-Cavity Surface-Emitting Laser on GaAs (311)B Substrate for Stable Polarization Operation," IEEE Journal on Selected Topics in Quantum Electronics, 7(2): 242-248 (2001).
Okuno, Y.L., et al., "1.3 μm Wavelength Vertical Cavity Surface Emitting Laser Fabricated by Orientation-Mismatched Wafer Bonding: A Prospect for Polarization Control," Applied Physics Letters, 82(15): 2377-2379 (2003).
Okuno, Y.L., et al., "Polarization Control of 1.3 um-Wavelength Vertical Cavity Surface Emitting Laser (VCSEL) Fabricated by Orientation-Mismatched Wager Bonding," IEEE, 17-18 (2002).
Ortsiefer, M., et al., "Polarization Control in Buried Tunnel Junction VCSELs Using a Birefrigent Semiconductor/Dielectric Subwavelength Grating," IEEE Photonics Technology Letters, 22(1): 15-17 (2010).
Ostermann, J.M., et al., "Chapter 5 Polarization Control of VCSELs," VCSELs, Springer Series in Optical Sciences 166, 147-179 (2013).
Ostermann, J.M., et al., "Polarization-Controlled Surface Grating VCSELs Under Externally Induced Anisotropic Strain," IEEE Photonics Technology Letters, 19 (17): 1301-1303 (2007).
Ostermann, J.M., et al., "Polarization-Stable Oxide-Confied VCSELs With Enhanced Single-Mode Output Power Via Monolithically Integrated Inverted Grating Reliefs," IEEE Journal of Selected Topics in Quantum Electronics, 11(5): 982-989 (2005).
Rao, Y., et al., "Long-Wavelength VCSEL Using High-Contrast Grating," IEEE Journal of Selected Topics in Quantum Electronics, 19(4) (2013).
Sato, Y., et al., "Polarization Bistable Characteristics of Mesa Structure 980 nm Vertical-Cavity Surface-Emitting Lasers," Japanese Journal of Applied Physics, 45 (16): L438-440 (2006).
Van der Sande, G., et al., "The Effects of Stress, Temperature, and Spin Flips on Polarization Switching in Vertical-Cavity Surface-Emitting Lasers," IEEE Journal of Quantum Electronics, 42(9): 898-906 (2006).
Vest, G., et al., "Design and Evaluation of a Handheld Quantum Key Distribution Sender Module," IEEE Journal of Selected Topics in Quantum Electronics, 21(3) (2015).
Yang, Y., et al., "Integration of VCSEL on Silicon Photonics Using a Grating Coupler for Polarization Control and In-Plane Coupling," IEEE (2017).
Yoshikawa, T., et al., "Polarization-Controlled Single-Mode VCSEL," IEEE Journal of Quantum Electronics, 34(6): 1009-1015 (1998).
Zheng, Y., et al., "Control of Polarization Phase Offset in Low Treshold PolariZation Switching VCSELs," IEEE Photonics Technology Letters, 23(5): 305-307 (2011).
Johnson, B., et al., "Tunable 1060 nm VCSEL co-packaged with Pump and SOA for OCT and LiDar," Proc. of SPIE, 10867: 1086706-1-1086706-10 (2019).
Yano, T., et al., "Wavelength Modulation Over 500 kHz of Micromechanically Tunable InP-Based VCSELs with Si-MEMS Technology," IEEE Journal of Selected Topics in Quatum Electronics, 15(3): 528-534 (2009).
International Search Report and Written Opinion of the International Searching Authority, dated Aug. 14, 2019, from International Application No. PCT/US2019/031800, filed on May 10, 2019. 20 pages.
International Preliminary Report on Patentability, dated Nov. 26, 2020, from International Application No. PCT/US2019/031800, filed on May 10, 2019. 11 pages.

* cited by examiner

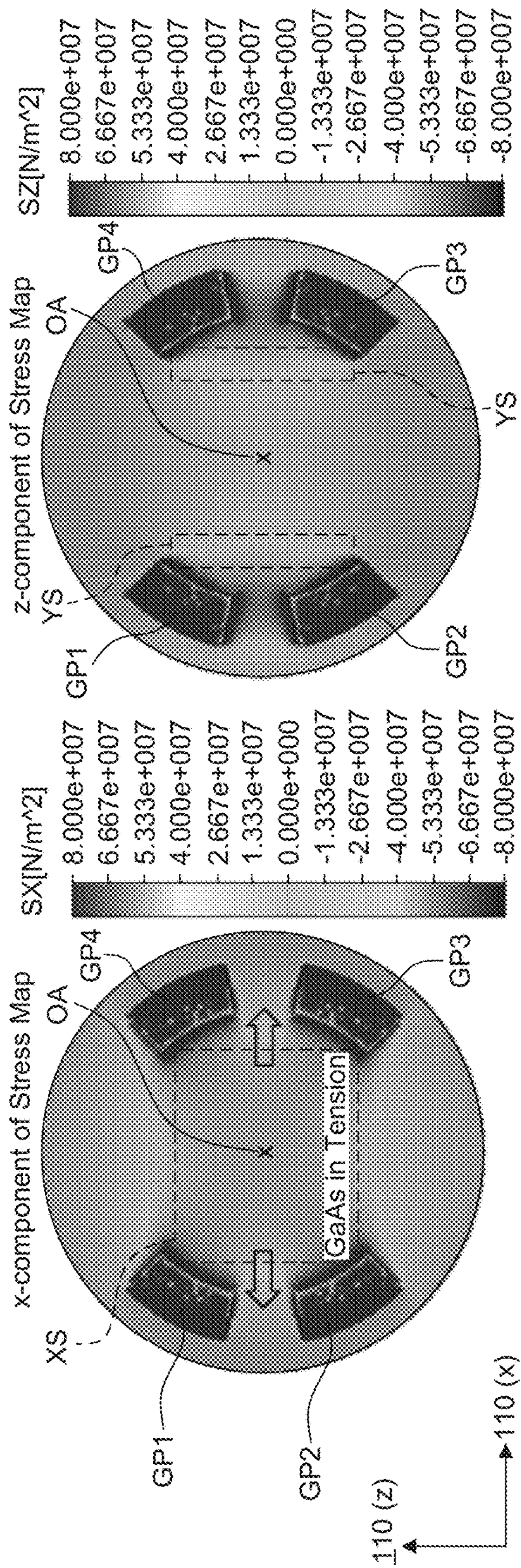
Fig. 3A
Fig. 3B
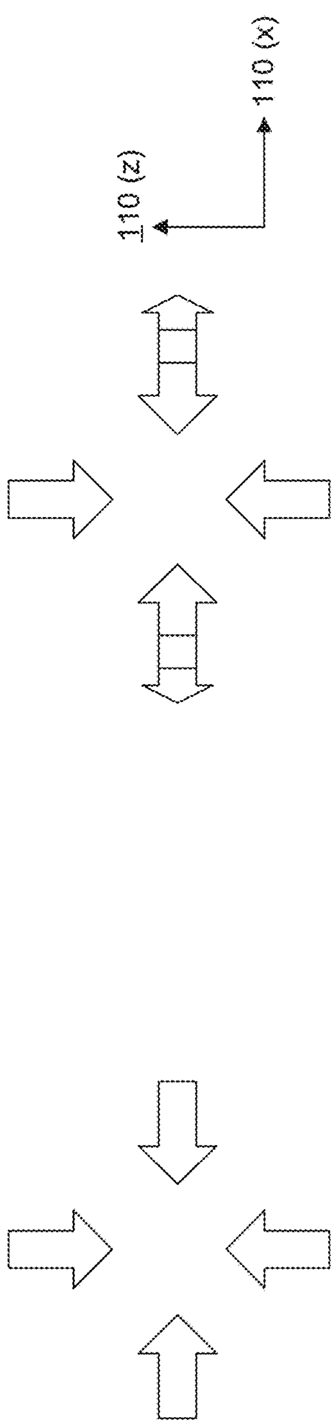
Fig. 4A
Fig. 4B

TUNABLE VCSEL POLARIZATION CONTROL THROUGH DISSIMILAR DIE BONDING

RELATED APPLICATIONS

This application claims the benefit under 35 USC 119(e) of U.S. Provisional Application No. 62/670,514, filed on May 11, 2018, which is incorporated herein by reference in its entirety.

BACKGROUND OF THE INVENTION

Vertical cavity surface emitting lasers (VCSELs) need some sort of asymmetry built into the device to select for controlled linear polarized output. This asymmetry can be provided by rectangular mesas [1], high contrast grating mirrors [2,3], subwavelength gratings [4], possible strain from oxidized DBR mirrors [5], asymmetric metal strain films applied to the crystal [6], asymmetric current apertures [8,9], surface gratings [10], growth on tilted crystal planes [11,12], externally induced asymmetric strain [13], polarization loss anisotropy [14], or asymmetric current injection [15].

SUMMARY OF THE INVENTION

The present invention concerns a design and method for introducing asymmetric crystal strain to control polarization in a tunable VCSEL, either optically or electrically pumped.

The invention is especially relevant to wafer- or die-bonded tunable VCSELs. Examples of such devices are disclosed in United States Patent Application US20140176958A1, by Flanders, Kuznetsov, Atia, and Johnson, "OCT System with Bonded MEMS Tunable Mirror VCSEL Swept Source", which is incorporated herein in its entirety.

In general, according to one aspect, the invention features a vertical cavity surface emitting lasers (VCSEL), comprising a membrane device and a half VCSEL device. Then, mechanical stress is applied to the half VCSEL device.

This mechanical stress controls a polarization of light generated by the VCSEL. In the present design, the mechanical stress is applied by the membrane device to the half VCSEL device.

Preferably, the mechanical stress is generated by bonding the membrane device to the half VCSEL device under elevated temperature. At the same time, the VCSEL device and the membrane device have different coefficients of thermal expansion. Preferably, the membrane device is thermocompression bonded to the half VCSEL device.

In general, according to another aspect, the invention features a VCSEL, comprising a membrane device, a half VCSEL device, and bond pads attaching the membrane device to the half VCSEL device. A distance between the bond pads is different between two axes of a plane of the membrane device and the half VCSEL device. This asymmetric is used to create mechanical stress in the half VCSEL device.

In general, according to another aspect, the invention features a method for fabricating a VCSEL, the method comprising: fabricating a membrane device, fabricating a half VCSEL device, and bonding the membrane device to the half VCSEL device to induce mechanical stress in the half VCSEL device.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIGS. 3A and 3B are finite element analyses of the stress on the ½ VCSEL;

FIGS. 4A and 4B schematically illustrates the change in stress resulting from the wafer bonding process in the ½ VCSEL;

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
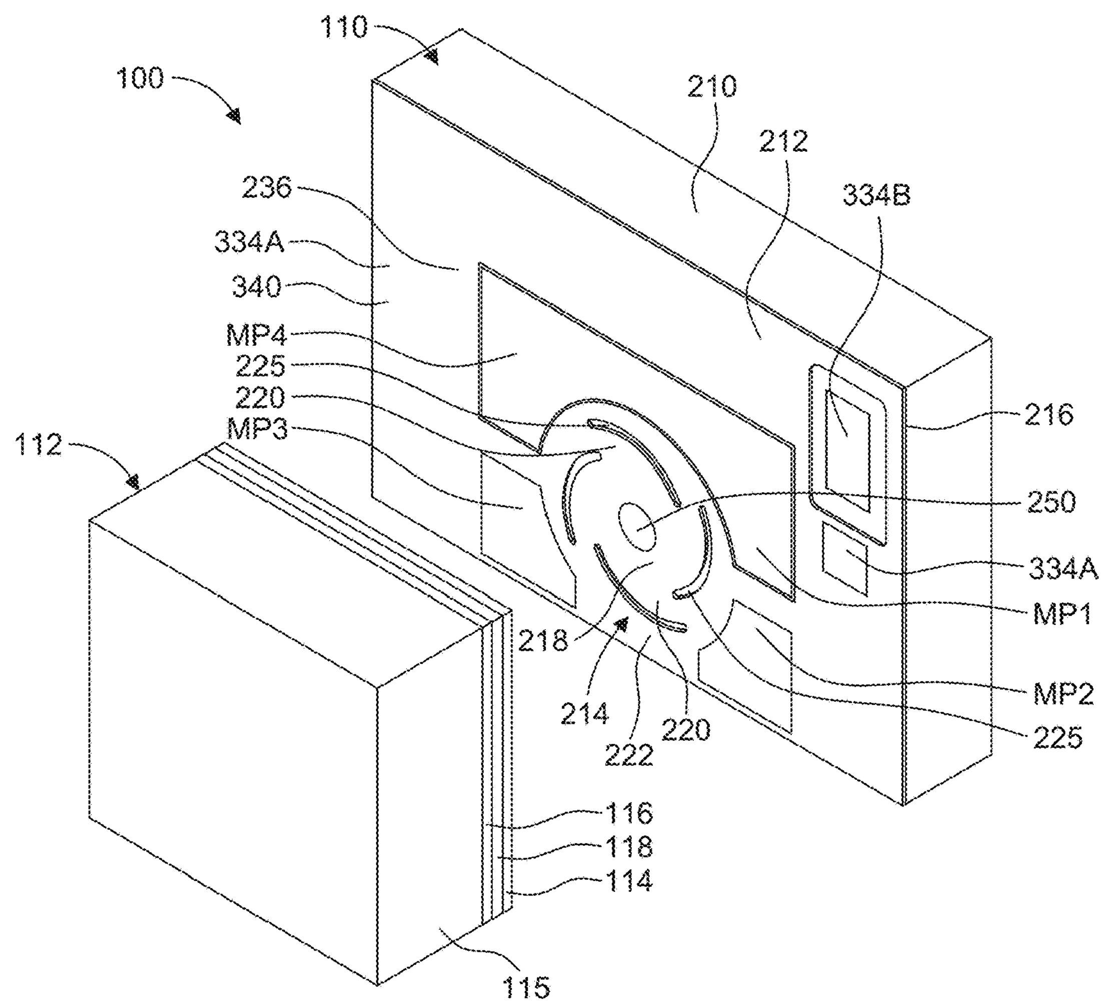
FIG. 1 is an exploded perspective view of a wafer- or die-bonded tunable VCSEL to which the present invention is applicable.

FIG. 1 shows a MEMS tunable VCSEL 100 comprising a MEMS membrane (mirror) device 110 that is bonded to what is termed a half VCSEL chip or device 112.

In more detail, the optical membrane device 110 comprises handle wafer material 210 that functions as a support. Currently, the handle is made from doped silicon, with a resistivity <0.1 ohm-cm, carrier concentration $>1\times10^{17}$ $cm^{-3}$, to facilitate electrical contact.

An optical membrane or device layer 212 is added to the handle wafer material 210. Typically silicon on isolator (SOI) wafers are used. An optical membrane structure 214 is formed in this optical membrane layer 212. In the current implementation, the membrane layer 212 is silicon that is low doped with resistivity >1 ohm-cm, carrier concentration $<5\times10^{15}$ $cm^{-3}$, to minimize free carrier absorption of the transmitted light. For electrical contact, the membrane layer surface is usually additionally doped by ion implantation to create a highly doped surface layer (doped usually to $>1\times10^{18}$ $cm^{-3}$, but at least $1\times10^{17}$ $cm^{-3}$ and at least 200 Angstroms (Å) thick, usually 500-2000 Å thick). This method minimizes optical absorption in the membrane layer itself that would occur if the entire layer were highly doped. An insulating (buried silicon dioxide) layer 216 separates the optical membrane layer 212 from the handle wafer material 210.

During manufacture of the membrane device in the SOI wafer material, the insulating layer 216 functions as a sacrificial/release layer, which is partially removed to release the membrane structure 214 from the handle wafer material 210. Then during operation, the remaining portions of the insulating layer 216 provide electrical isolation between the patterned device layer 212 and the handle material 210.

In the current embodiment, the membrane structure 214 comprises a body portion 218. The optical axis of the device 100 passes concentrically through this body portion 218 and orthogonal to a plane defined by the membrane layer 212. A diameter of this body portion 218 is preferably 300 to 600 micrometers; currently it is about 500 micrometers.

Tethers 220 (four tethers in the illustrated example) defined and delineated by arcuate slots 225 fabricated into the device layer 212. The tethers 220 extend radially from the body portion 218 to an outer portion 222, which comprises the ring where the tethers 220 terminate. In the current embodiment, a spiral tether pattern is used.

A membrane mirror dot 250 is disposed on body portion 218 of the membrane structure 214. In some embodiments, the membrane mirror 250 is an optically curved to form an optically concave optical element to thereby form a curved mirror laser cavity. In other cases, the membrane mirror 250 is a flat mirror, or even possibly convex.

When a curved membrane mirror 250 is desired, this curvature can be created by forming a depression in the body portion 218 and then depositing the material layer or layers that form mirror 250 over that depression. In other examples, the membrane mirror 250 can be deposited with a high amount of compressive material stress that will result in its curvature.

The membrane mirror dot 250 is preferably a reflecting dielectric mirror stack. In some examples, it is a dichroic mirror-filter that provides a defined reflectivity, such as between 1 and 99.9%, to the wavelengths of laser light generated in the laser 100, whereas the optical dot 250 is transmissive to wavelengths of light that are used to optically pump the active region in the VCSEL device 112. In still other examples, the optical dot is a reflective metal layer such as aluminum or gold.

In the illustrated embodiment, four metal pads MP1, MP2, MP3, and MP4 are deposited on the proximal side of the membrane device 110. These are used to solder or thermocompression bond, for example, the half VCSEL device 112 onto the proximal face of the membrane device 110.

Also provided are two wire bondpads 334A, 334B. Membrane wire bond pad 334A is used to provide an electrical connection to the membrane layer 212 and thus the membrane structure 214. The handle wire bond pad 334B is used to provide an electrical connection to the handle wafer material 210.

The half VCSEL device 112 generally comprises an antireflective coating 114, which is optional, and an active region 118, which preferably has a single or multiple quantum well structure. The cap layer can be used between the antireflective coating 114, if present, and the active region 118. The cap layer protects the active region from the surface/interface effects at the interface to the AR coating and/or air. The back mirror 116 of the laser cavity is defined by a distributed Bragg reflector (DBR) mirror. Finally, a half VCSEL spacer 115, such as GaAS, functions as a substrate and mechanical support. The DBR can be grown into the semiconductor, or be a deposited dielectric DBR, or hybrid metal/dielectric mirror deposited near the active layer after etching a hole or "port" in the semiconductor substrate.

The material system of the active region 118 of the VCSEL device 112 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Quantum well layers may be purposely strained or unstrained depending the exact materials and the desired wavelength coverage.

In still other examples, the rear VCSEL distributed Bragg reflector (DBR) mirror 116 is a dichroic mirror-filter that provides a defined reflectivity, such as greater than 99% to the wavelengths of laser light generated in the laser 100, whereas the rear mirror 116 is transmissive to wavelengths of light that are used to optically pump the active region in the VCSEL device 112, thus allowing the half VCSEL device 112 to function as an input port of pump light.

In the example of a VCSEL operating with a center wavelength around 1050 nm, the mirror reflectivities tend toward higher numbers for light around 1050 nm in wavelength. For example, the reflectivity of the back mirror 116 is about 99.99%. On the other hand, the front mirror dot 250 is usually 99% or greater. In current embodiments, the mirror dot 250 has a reflectivity of about 99.4% or higher.

In operation, the VCSEL device is electrically or optically pumped. The generated light resonates between the rear mirror 116 and membrane mirror 250. The wavelength of the generated light is tuned within the scan band of the device by the out of plane electrostatic deflection of the body portion 218 and thus the membrane mirror 250 by controlling the electrostatic field between the body portion 218 and the handle wafer material 210 and/or the half VCSEL device 112.

According to the invention, asymmetric mechanical stress is applied to the half VCSEL device 112 in order to obtain polarization control.

Figure 2:
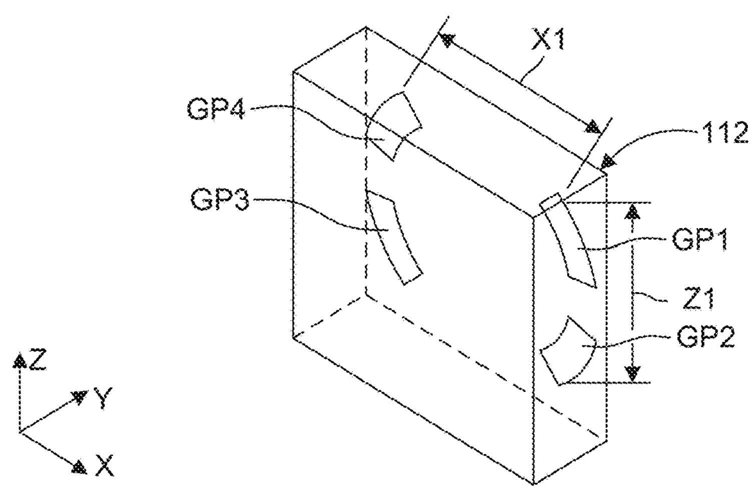
FIG. 2 is a schematic perspective view of the half VCSEL showing the locations of the bond pads.

FIG. 2 is schematic view showing the hidden bond pads GP1-GP4 on the half VCSEL device 112.

The asymmetric strain is created in the ½ VCSEL device 112 by the die bonding process. In one embodiment using thermocompression bonding, thin gold pads GP1-GP4 on the ½ VCSEL device 112 are bonded to corresponding membrane pads MP1, MP2, MP3, and MP4 of the MEMS membrane (mirror) device 110 by placing them in contact at high pressure and temperature to form the bond. Typically, this is done at 300-360° C. and 1-10N force. Other elevated temperature bonding methods, such as gold-tin and/or eutectic soldering, can be used to produce a similar effect, however.

The two substrates (½ VCSEL device 112/MEMS membrane (mirror) device 110) are made of different materials. The MEMS membrane (mirror) device 110 is made on a silicon substrate. The gain medium of the half VCSEL device 112 is typically grown on a direct bandgap semiconductor substrate such as GaAs or InP.

The bond is made between unstrained materials at high temperature. When the bonded structure cools, however, strain is introduced because of the different coefficients of thermal expansion (CTE) between the silicon MEMS membrane device 110 and the substrate material used for the optical gain medium of the half VCSEL device 112. Although this procedure can be performed for many different materials systems, here we will use an example of InGaAs quantum well active or gain medium 118 on a GaAs substrate VCSEL spacer 115 that lases near 1050 nm. Generally, this material system is used to generate light in the 980-1100 nm range. The VCSEL is tunable to sweep its output through a band, which is typically greater than 50 nm wide and often more than 100 nm wide, centered on 1050 nm.

An asymmetric bond pad arrangement is used to produce asymmetric stress. Specifically, the bond pad arrangement is asymmetric in that the x-axis distance (X1) between the pads is greater than the z-axis distance (Z1) between the pads. Said another way, a distance between the bond pads is different between two axes of a plane of the membrane device and the half VCSEL device. The bond pad asymmetry is designed so that the added stress asymmetry to the ½ VCSEL from bonding to the membrane device 112 is between 20 and 100 MPa.

FIGS. 3A and 3B are grayscale coded finite element analysis of the stress in a GaAs ½ VCSEL 112 after thermocompression bonding. The gold pads GP1-GP4 are under heavy stress.

FIG. 3A shows the x-component of the stress is along the GaAs 110 crystal direction. In general, the x-component stress in high in region XS surrounding the device's optical axis OA.

On the other hand, FIG. 3B shows the y-component of the stress is elevated only in regions away YS, which are from the optical axis.

Two effects in the strained crystal control the polarization. The crystal is made birefringent, so it maintains polarization the same way a polarization-maintaining fiber does. Also, an optical gain asymmetry develops for polarizations aligned along the 110 and $\underline{1}10$ crystal directions. (These crystal orientations are chosen for illustration purposes; other orientations could be chosen, however.)

The following comments apply to many different quantum well material systems at many different wavelength ranges, both strained and unstrained as grown, but here the InGaAs/GaAs material system for the 1050 nm range is used as an example. With compressively strained InGaAs quantum wells, tunable lasers generated tunable swept wavelength optical signal in the range 980-1100 nm or more can be constructed. The compressive strain shifts the emission to longer wavelengths and increases the optical gain for TE (transverse electric field) polarization, polarized in the plane of the quantum well layers. The compressive stress fields before and after wafer bonding are shown in FIGS. 4A and 4B, respectively. These figures show how the wafer bonding transforms the symmetrically compressed quantum wells (FIG. 4A) to the asymmetrically compressed wells (FIG. 4B) because of the subtraction of the stress due to the wafer bonding process. The highest stress is along the HO-crystal orientation (z direction) so the optical gain is highest in the z direction as well.

Figure 5:
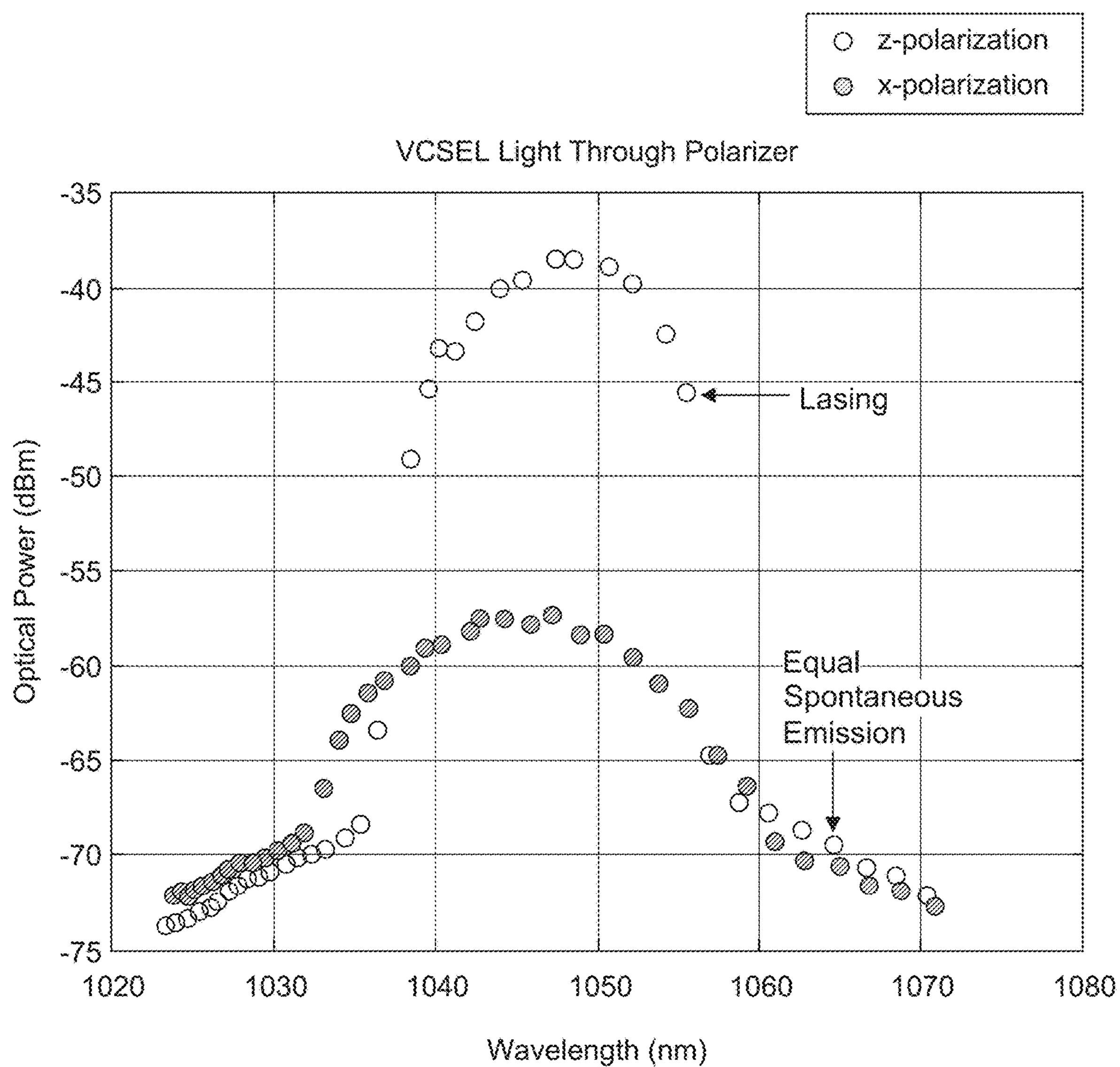
FIG. 5 is a plot of optical power (dBm) as a function of wavelength for the different polarizations.

The gain is higher for the z-polarization, so the VCSEL lases with that polarization as shown in FIG. 5. This figure shows experimental results. It illustrates linear polarization for a 1050 nm tunable VCSEL. The polarization is aligned along the highest stress axis of the bonded die crystal.

REFERENCES

[1] Y. Sato, T. Mori, Y. Yamayoshi, and H. Kawaguchi, "Polarization Bistable Characteristics of Mesa Structure 980 nm Vertical-Cavity Surface-Emitting Lasers", Japanese Journal of Applied Physics, 45, L438-L440, (2006)

[2] Y. Rao, W. Yang, C. Chase, M. C. Y. Huang, D. P. Worland, S. Khaleghi, M. R. Chitgarha, M. Ziyadi, A. E. Willner, and C. J. Chang-Hasnain, "Long-Wavelength VCSEL Using High-Contrast Grating", IEEE J. Selected Topics in Quantum Electronics, 19, 1701311-1701311 (2013)

[3] Thor Ansbaek Ph.D. thesis, "Vertical-cavity surface-emitting lasers for medical diagnosis", Department of Photonics Engineering at The Technical University of Denmark (2012)

[4] M. Ortsiefer, M. Goerblich, Y. Xu et al., Polarization control in buried tunnel junction VCSELs using a birefringent semiconductor/dielectric subwavelength grating. IEEE Photon. Technol. Lett. 22, 15-17 (2010)

[5] V. Jayaraman, J. Jiang, B. Potsaid, M. Robertson, P. J. S. Heim, C. Burgner, D. John, G. D. Cole, I. Grulkowski, J. G. Fujimoto, A. M. Davis, and A. E. Cable, "VCSEL Swept Light Sources", Section 22.5.4 Polarization stability, in *Optical Coherence Tomography*, W. Drexler, J. G. Fujimoto (eds.), Springer International Publishing Switzerland 2015.

[6]Y. Matsui, D. Vakhshoori, P. Wang, P. Chen, C-C. Lu, M. Jiang, K. Knopp, S. Burroughs, and P. Tayebati, "Complete Polarization Mode Control of Long-Wavelength Tunable Vertical-Cavity Surface-Emitting Lasers Over 65-nm Tuning, Up to 14-mW Output Power", IEEE J. Quantum Electronics, 39, 1037-1048 (2003)

[7] United States Patent Application US20140176958A1, D. C. Flanders, M. E. Kuznetsov, W. A. Atia, B. C. Johnson, "OCT System with Bonded MEMS Tunable Mirror VCSEL Swept Source", Priority date 2012 Dec. 21.

[8] M. A. Bobrov, N. A. Maleev, S. A. Blokhin, A. G. Kuzmenkov, A. P. Vasil'ev, A. A. Blokhin, M. M. Kulagina, Yu. A. Guseva, S. I. Troshkov, W. Lysak, and V. M. Ustinov, "VCSEL polarization control by rhomboidal selectively-oxidized current aperture", 2016 International Conference Laser Optics (LO) Page R3-16 (2016)

[9] K-H. Ha and Y-H. Lee, "Polarization Control of Vertical-Cavity Surface-emitting Lasers by Asymmetric Oxide-aperture", (CLEO) Conference on Lasers and Electro-Optics/Pacific Rim '99/Paper 2.30, Pages 890-891.

[10] P. Debernardi, J. M. Ostermann, M. Feneberg, C. Jalics, and R. Michalzik, "Reliable Polarization Control of VCSELs Through Monolithically Integrated Surface Gratings: A Comparative Theoretical and Experimental Study", IEEE J. on Selected Topics in Quantum Electronics, 11, 107-116 (2005)

[11] N. Nishiyama, M. Arai, S. Shinada, M. Azuchi, T. Miyamoto, F. Koyama, and K. Iga, "Highly Strained GalnAs—GaAs Quantum-Well Vertical-Cavity Surface-Emitting Laser on GaAs (311)B Substrate for Stable Polarization Operation", IEEE J. on Selected Topics in Quantum Electronics, 7, 242-248 (2001)

[12] Y. L. Okuno, J. Geske, K-G. Gan, Y-J. Chiu, S. P. DenBaars, and J. E. Bowers, "1.3 mm wavelength vertical cavity surface emitting laser fabricated by orientation-mismatched wafer bonding: A prospect for polarization control", Applied Physics Letters, 82, 2377-2379 (2003)

[13] J. M. Ostermann, P. Debernardi, A. Kroner, and R. Michalzik, "Polarization-Controlled Surface Grating VCSELs Under Externally Induced Anisotropic Strain", IEEE Photonics Technology Letters, 19, 1301-1303 (2007)

[14] T. Yoshikawa, T. Kawakami, H. Saito, H. Kosaka, M. Kajita, K. Kurihara, Y. Sugimoto, and K. Kasahara, "Polarization-Controlled Single-Mode VCSEL", IEEE J. of Quantum Electronics, 34, 1009-1015 (1998)

[15] Y. Zheng, C-H. Lin, and L. A. Coldren, "Control of Polarization Phase Offset in Low Threshold Polarization Switching VCSELs," IEEE Photonics Technnology Letters, 23, 305-307 (2011)

While this invention has been particularly shown and described with references to preferred embodiments thereof, it will be understood by those skilled in the art that various changes in form and details may be made therein without departing from the scope of the invention encompassed by the appended claims.

What is claimed is:

1. A VCSEL, comprising:

a membrane device including an optical membrane and a mirror dot on the optical membrane;

a half VCSEL device including a quantum well structure and a distributed Bragg reflector mirror, in which during operation light resonates between the distributed Bragg reflector mirror and membrane mirror dot and electrostatic deflection of the optical membrane is used to tune a wavelength of the VCSEL;

wherein asymmetric mechanical stress is applied to the half VCSEL device by the membrane device to control a polarization of light generated by the VCSEL.

2. The VCSEL of claim 1, wherein the mechanical stress is generated by bonding the membrane device to the half VCSEL device under elevated temperature.

3. The VCSEL of claim 1, wherein the membrane device is thermocompression bonded to the half VCSEL device.

4. The VCSEL of claim 1, wherein an added stress asymmetry to the half VCSEL from bonding to the membrane device is between 20 and 100 MPa.

5. A VCSEL, comprising:

a membrane device including an optical membrane, a mirror dot on the optical membrane;

a half VCSEL device including a quantum well structure and a distributed Bragg reflector mirror, in which during operation light resonates between the distributed Bragg reflector mirror and membrane mirror dot and electrostatic deflection of the optical membrane is used to tune a wavelength of the VCSEL; and four bond pads attaching the membrane device to the half VCSEL device, wherein a distance between the four bond pads is different between two axes of a plane of the membrane device and the half VCSEL device to apply asymmetric mechanical stress to the half VCSEL device.

6. The VCSEL of claim 5, wherein the membrane devices applies asymmetrical mechanical stress to the half VCSEL device to control a polarization of light generated by the VCSEL.

7. The VCSEL of claim 5, wherein mechanical stress is generated by bonding the membrane device to the half VCSEL device under elevated temperature.

8. The VCSEL of claim 5, wherein the membrane device is thermocompression bonded to the half VCSEL device.

9. The VCSEL of claim 5, wherein an added stress asymmetry to the half VCSEL from bonding to the membrane device is between 20 and 100 MPa.

10. A method for fabricating a VCSEL, the method comprising:

fabricating a membrane device including an optical membrane and a mirror dot on the optical membrane;

fabricating a half VCSEL device;

bonding the membrane device to the half VCSEL device to induce asymmetrical mechanical stress in the half VCSEL device by the membrane device to control a polarization of light generated by the VCSEL.

11. The method of claim 10, further comprising metal bonding the membrane device to the half VCSEL device.

12. The method of claim 10, further comprising thermocompression bonding the membrane device to the half VCSEL device.

13. The method of claim 10, wherein an added stress asymmetry to the half VCSEL from bonding to the membrane device is between 20 and 100 MPa.

* * * * *